(12) United States Patent
Hirai et al.

(10) Patent No.: US 9,136,189 B2
(45) Date of Patent: Sep. 15, 2015

(54) SURFACE OBSERVATION APPARATUS AND SURFACE OBSERVATION METHOD

(75) Inventors: Takehiro Hirai, Ushiku (JP); Kenji Obara, Kawasaki (JP); Naoma Ban, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 889 days.

(21) Appl. No.: 13/318,718

(22) PCT Filed: May 25, 2010

(86) PCT No.: PCT/JP2010/058837
§ 371 (c)(1),
(2), (4) Date: Nov. 3, 2011

(87) PCT Pub. No.: WO2010/140511
PCT Pub. Date: Dec. 9, 2010

(65) Prior Publication Data
US 2012/0044262 A1 Feb. 23, 2012

(30) Foreign Application Priority Data
Jun. 3, 2009 (JP) ................................ 2009-134284

(51) Int. Cl.
G06K 9/00 (2006.01)
H01L 21/66 (2006.01)
G06T 7/00 (2006.01)

(52) U.S. Cl.
CPC ................ *H01L 22/20* (2013.01); *G06T 7/001* (2013.01); *H01L 22/12* (2013.01);
(Continued)

(58) Field of Classification Search
None
See application file for complete search history.

(56) References Cited

U.S. PATENT DOCUMENTS 6,542,830 B1 * 4/2003 Nakazato et al. ............... 702/35
7,171,038 B2 * 1/2007 Adler et al. .................... 382/149
(Continued)

FOREIGN PATENT DOCUMENTS

JP 02-128147 A 5/1990
JP 04-367982 A 12/1992
(Continued)

OTHER PUBLICATIONS

Japanese Office Action, w/ English translation thereof, issued in Japanese Patent Application No. JP 2009-134284 dated May 14, 2013.
(Continued)

*Primary Examiner* — Jayesh A Patel
(74) *Attorney, Agent, or Firm* — McDermott Will & Emery LLP

(57) ABSTRACT

A surface observation apparatus is achieved, which enables even a beginner to easily select an optimal evaluation indicator for each of various patterns to be evaluated without a trial and error approach. A plurality of images to be evaluated are input from an image processing unit (114) to an evaluation image input unit (113a) (in step 901). The input images to be evaluated are displayed on a display (115). A user rearranges the images in accordance with an evaluation criterion of the user while referencing the display (115), and defines an evaluation criterion (in step 902). Evaluation values are calculated for the input images (to be evaluated) using a plurality of evaluation indicators (in step 903). The evaluation values for each of the evaluation indicators are compared with the evaluation criterion defined by the user, and correlation coefficients are then calculated (in step 904). An evaluation indicator having the maximum absolute value of a correlation coefficient is automatically selected as an evaluation criterion that is closest to the evaluation criterion defined by the user (in step 905). The images are rearranged in order of correlation coefficient and a list of the images is displayed on the display (115) so that the images are arranged in order of evaluation value (in step 906).

21 Claims, 11 Drawing Sheets

(52) U.S. Cl.
CPC .. *G06T 2200/24* (2013.01); *G06T 2207/10061* (2013.01); *G06T 2207/30148* (2013.01); *H01L 2924/0002* (2013.01)

(56) References Cited

U.S. PATENT DOCUMENTS

| | | | |
|---|---|---|---|
| 7,949,178 B2 * | 5/2011 | Sakai et al. | 382/144 |
| 2001/0053245 A1 * | 12/2001 | Sakai et al. | 382/151 |
| 2003/0025904 A1 | 2/2003 | Sakai et al. | |
| 2004/0228515 A1 | 11/2004 | Okabe et al. | |
| 2006/0274933 A1 | 12/2006 | Obara et al. | |
| 2007/0274609 A1 | 11/2007 | Hirai et al. | |
| 2008/0031511 A1 * | 2/2008 | Sakai et al. | 382/149 |
| 2008/0075352 A1 | 3/2008 | Shibuya et al. | |
| 2008/0317329 A1 | 12/2008 | Shibuya et al. | |
| 2009/0292387 A1 * | 11/2009 | Funakoshi | 700/110 |

FOREIGN PATENT DOCUMENTS

| | | |
|---|---|---|
| JP | 09-229865 A | 9/1997 |
| JP | 11-344450 A | 12/1999 |
| JP | 2001-147113 A | 5/2001 |
| JP | 2001-156135 A | 6/2001 |
| JP | 2002-303586 A | 10/2002 |
| JP | 3538623 B2 | 6/2004 |
| JP | 2004-294358 A | 10/2004 |
| JP | 2008-004081 A | 1/2008 |
| JP | 2008-082821 A | 4/2008 |
| JP | 2009-002743 A | 1/2009 |

OTHER PUBLICATIONS

Notification of Transmittal and (PCT/IB/338) Translation of the International Preliminary Report on Patentability PCT/JP2010/058837, Jan. 26, 2012

The Written Opinion of the International Searching Authority (PCT/ISA/237) PCT/JP2010/058837, Jan. 26, 2012.

* cited by examiner

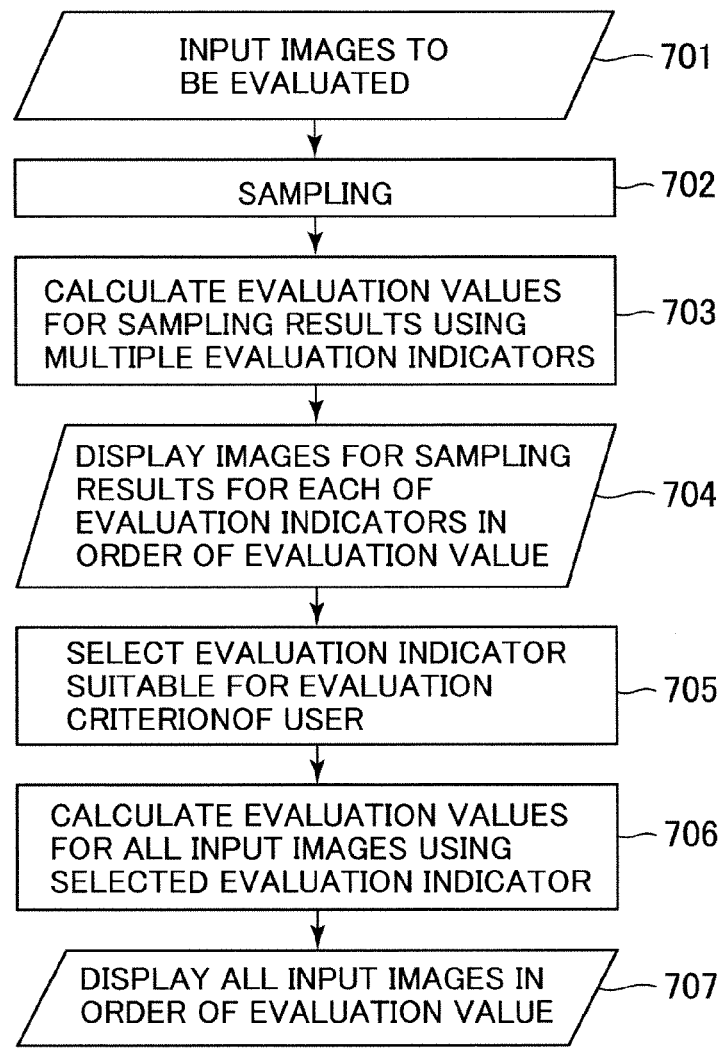
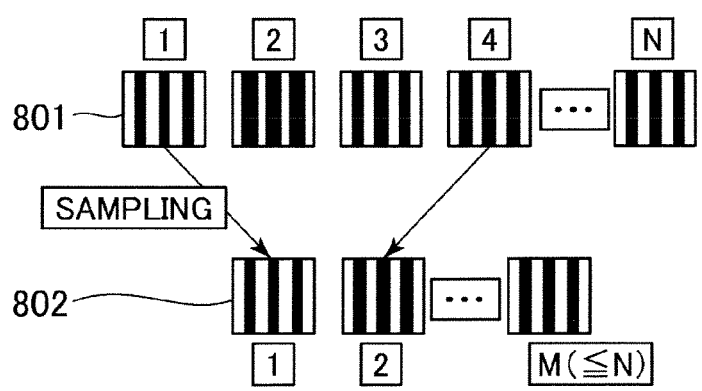

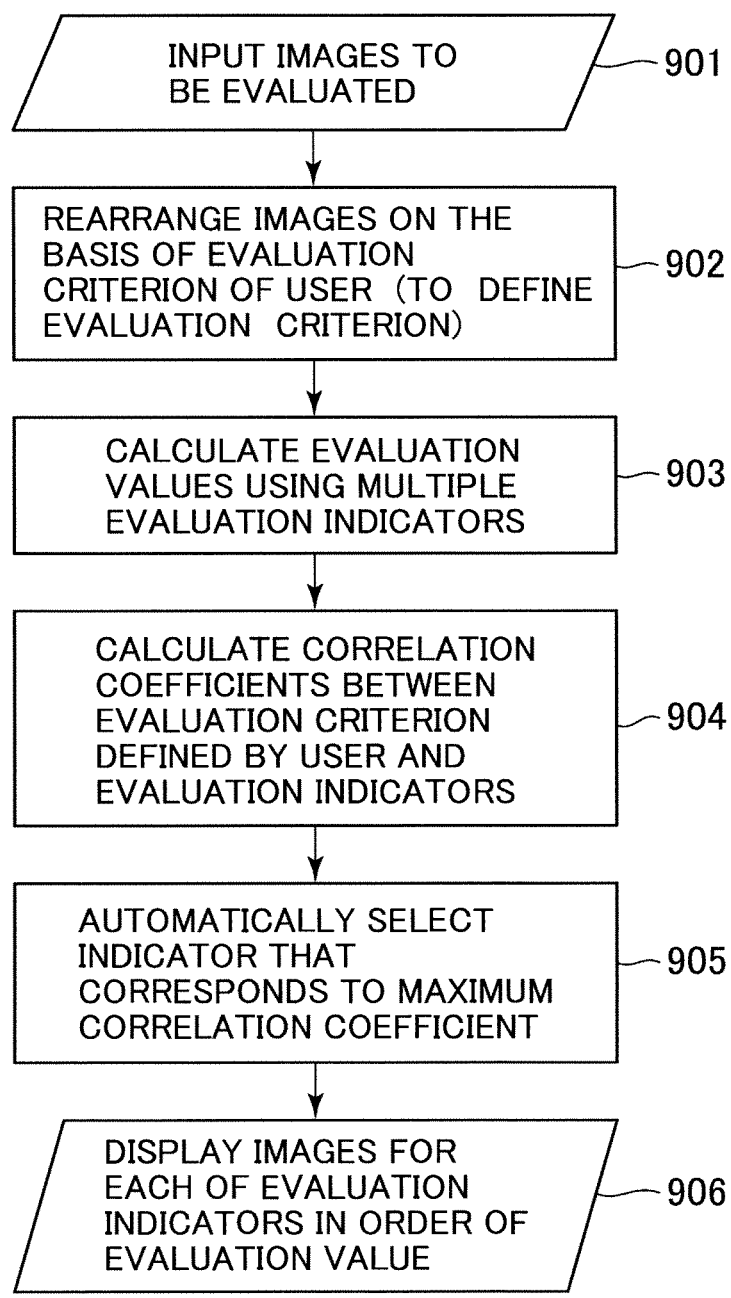

FIG. 15

| No. | 1401 | INDICATOR NAME 1402 | CORRELATION COEFFICIENT (INDEPENDENT INDICATOR) ▶ 1403 | WEIGHT 1404 1405 | #1 | #2 | #3 |
|---|---|---|---|---|---|---|---|
| ◆ | 1 | AREA OF DIFFERENCE | 0.82 | 0.30 | 0.50 | 0.50 | — |
| ◆ | 2 | NUMBER OF DEFECTS | 0.80 | 0.50 | 0.50 | 0.30 | — |
| ◆ | 3 | DISTANCE BETWEEN PATTERNS | 0.79 | 0.20 | — | 0.20 | — |
| ◇ | 4 | LUMINESCENCE DISTRIBUTION | 0.76 | — | — | — | — |
| ◇ | 5 | MEASURED LENGTH | 0.69 | — | — | — | — |
| | | CORRELATION COEFFICIENTS OF COMBINED EVALUATION INDICATOR | | | 0.81 | 0.82 | — | ns

SURFACE OBSERVATION APPARATUS AND SURFACE OBSERVATION METHOD

RELATED APPLICATIONS

This application is the U.S. National Phase under 35 U.S.C. §371 of International Application No. PCT/JP2010/058837, filed on May 25, 2010, which in turn claims the benefit of Japanese Application No. 2009-134284, filed on Jun. 3, 2009, the disclosures of which Applications are incorporated by reference herein.

TECHNICAL FIELD

The present invention relates to a surface observation apparatus and a surface observation method configured to observe a surface of a sample under various observation conditions on the basis of a recipe in which the observation conditions are registered.

BACKGROUND ART

To ensure a high yield in a process of manufacturing semiconductors or the like, it is important to early find defects occurring in process and take corresponding measures. With miniaturization of semiconductors in recent years, the effect of a fine defect on the yield cannot be ignored and defects to be observed have diversified accordingly.

A scanning electron microscope (SEM) type defect observation apparatus is an apparatus that is adapted to observe such various defects. In general, the SEM type defect observation apparatus observes a defect on the basis of the position of the defect detected by an upstream-side inspection apparatus. However, the miniaturization of semiconductors has increased the number of cases in which the upstream-side inspection apparatus cannot detect a defect. Thus, it is important more and more to enhance a fixed-point observation function which is used to set a location and range to be observed in the SEM type observation apparatus for observation of defects.

In addition, for a fixed-point observation, especially, for process monitoring in a process of manufacturing semiconductors, a length measurement SEM has been used. The length measurement SEM measures the length of a specified pattern, treats the measured length as a management value, and quantifies the degree of completion of the process. However, when a variation in the pattern whose length is to be measured is excessively large, the length measurement SEM is susceptible to extremely large process variations, such as an open line pattern, a shorted line pattern, and the like.

In addition, users' evaluation indicators have diversified. As a result, adequate evaluation cannot be performed only with measurement values in some cases. Along with such a trend, it has strongly been requested that a degree of completion of the process should be quantified with the use of various evaluation indicators by using the fixed-point observation function of the SEM type defect observation apparatus.

Patent Document 1 discloses a method for appropriately using a plurality of pattern edge detection algorithms according to patterns to be evaluated and thereby improving the accuracy in length measurement.

In addition, Patent Document 2 discloses a defect inspection apparatus that displays on a screen an image of a defect, calculated contrast and a luminescence distribution side-by-side, so that a user can select an optimal test condition with ease.

In addition, Patent Document 3 discloses a defect inspection apparatus that displays a list of images for each of setting conditions and a list of evaluation indicators on a screen so as to support a user in selecting an optimal condition.

PRIOR ART REFERENCES

Patent Documents

Patent Document 1: JP-2001-147113-A
Patent Document 2: JP-2002-303586-A
Patent Document 3: JP-2004-294358-A

SUMMARY OF THE INVENTION

Problems to be Solved by the Invention

The optimal length measurement algorithm can be selected according to a pattern to be evaluated by the method disclosed in Patent Document 1. However, when the degree of completion of a process is to be quantified, the pattern to be evaluated is diverse. The number of cases in which the pattern cannot be evaluated only using a measured length has increased.

In addition, an apparatus that stores a measured length and a plurality of evaluation indicators exists. However, it is difficult for a beginner to select the optimal evaluation indicator from among the plurality of evaluation indicators.

As described in Patent Documents 2 and 3, a condition selection by the user is supported by a display of an image of a defect, calculated contrast and a luminescence distribution side-by-side, and a display of a list of evaluation indicators. However, the user still needs to select the optimal condition from among a plurality of conditions. It is therefore difficult for a beginner to select the optimal condition. If an experienced user can determine the optimal condition for a shorter time period, a time period for an inspection of a defect can be reduced. However, when any of the conventional techniques is used, it is difficult for the experienced user to reduce the time period for the defect inspection.

An object of the present invention is to achieve a surface observation apparatus and a surface observation method, which enable even a beginner to easily select an optimal evaluation indicator for each of various patterns to be evaluated without a trial and error approach.

Means for Solving the Problems

To accomplish the aforementioned object, the present invention is configured as follows.

A surface observation apparatus that observes a surface of a sample includes: an image processing unit that processes surface images of a plurality of parts on the surface of the sample; an indicator-based evaluation value calculating unit that calculates an evaluation value for each of the surface images processed by the image processing unit in accordance with a plurality of evaluation indicators; a correlation coefficient calculating unit that calculates a correlation coefficient between an evaluation criterion input by input means and each of the evaluation indicators, and selects an evaluation indicator that has the maximum correlation coefficient among the calculated correlation coefficients; and a display unit that displays on a screen, the evaluation indicator that has the maximum correlation coefficient selected by the correlation coefficient calculating unit (113f), as a recommended evaluation indicator.

Effect of the Invention

According to the present invention, since even a beginner can select, without a trial and error approach, an evaluation indicator that is optimal for an image to be observed, a time period for the selection of the indicator can be reduced. In addition, since existing evaluation indicators can be combined to form a new evaluation indicator, it is possible to suppress the cost of a software development and introduce the new evaluation indicator.

BRIEF DESCRIPTION OF THE DRAWINGS

FIG. 7 is a flowchart of operations according to the embodiment of the present invention, while the flowchart illustrates procedures of calculating an evaluation value using a plurality of evaluation indicators and selecting an evaluation indicator that is suitable for the evaluation criterion of the user, in which sampling is performed to limit images to be evaluated so that a time period for the process can be reduced.

FIG. 8 is a diagram illustrating the sampling that is performed to reduce the time period for the process according to the embodiment of the present invention.

FIG. 9 is a flowchart of operations according to the embodiment of the present invention, while the flowchart illustrates the operations of rearranging images, defining the evaluation criterion, and automatically selecting an evaluation indicator that is closest to the defined evaluation criterion.

FIG. 15 is a diagram illustrating an example of a GUI according to the embodiment of the present invention, while a command combination evaluation indicator is set and confirmed in the example.

The example illustrates the network system that includes the observation apparatuses, some of which have a function of evaluating an image to be observed.

MODE FOR CARRYING OUT THE INVENTION

Embodiments of the present invention are described below with reference to the accompanying drawings.

First Embodiment

A first embodiment of the present invention is described below.

Figure 1:
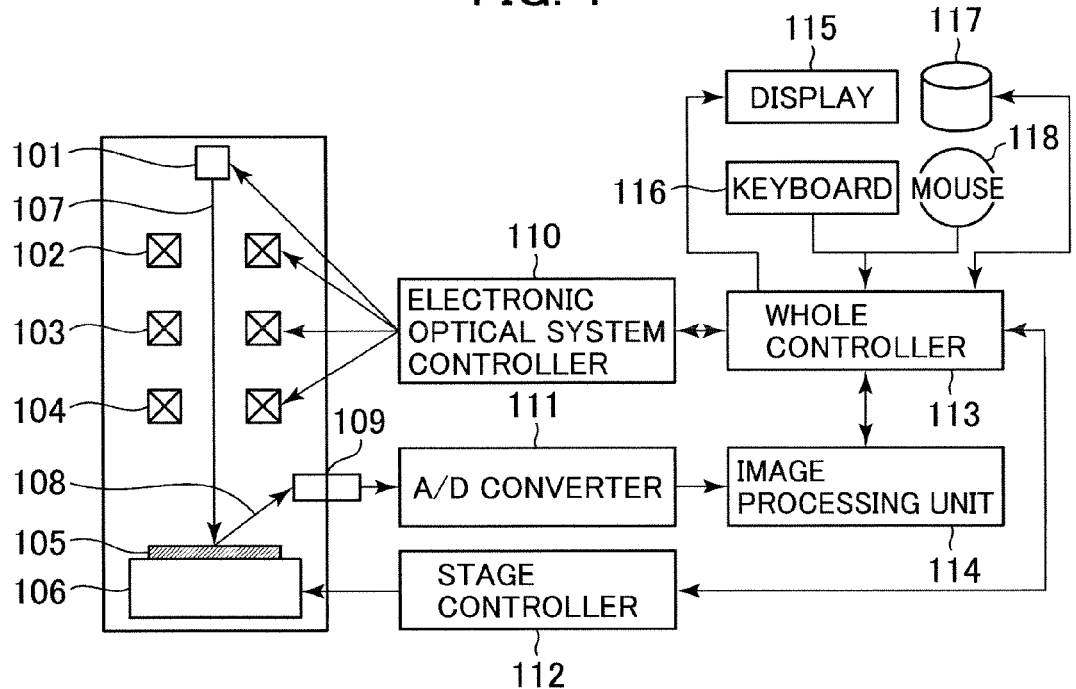
FIG. 1 is a diagram illustrating an outline configuration of an SEM type defect observation apparatus to which the present invention is applied.

FIG. 1 is a diagram illustrating an outline configuration of an SEM type defect observation apparatus that is an example of a surface observation apparatus according to the present invention. In FIG. 1, the SEM type defect observation apparatus includes an electron gun 101, a lens 102, a deflector 103, an objective lens 104, a stage 106, a secondary particle detector 109, an electronic optical system controller 110, an A/D converter 111, a stage controller 112, a whole controller 113, an image processing unit 114, a display 115, a keyboard 116, a storage device 117 and a mouse 118.

An electron beam 107 that is emitted from the electron gun 101 is focused by the lens 102. Then, the electron beam 107 is deflected by the deflector 103. After that, the electron beam 107 is focused by the objective lens 104. Then, a sample 105 is irradiated with the electron beam 107. Secondary particles 108 such as secondary electrons and reflected electrons are generated from the sample 105 irradiated with the electron beam 107, in accordance with the shape and material of the sample 105.

The generated secondary particles 108 are detected by the secondary particle detector 109. The A/D converter 111 converts the detected secondary particles 108 into a digital signal so as to generate an SEM image. The image processing unit 114 performs image processing (such as a defect detection) using the generated SEM image. The electronic optical system controller 110 controls the lens 102, the deflector 103 and the objective lens 104. The stage 106 is controlled by the stage controller 112 so as to control the position of the sample 105. The whole controller 113 interprets inputs from the keyboard 116, the mouse 118 and the storage device 117, controls the electronic optical system controller 110, the stage controller 112, the image processing unit 114 and the like, and outputs processed contents to the display 115 and the storage device 117 when necessary.

Figure 2:
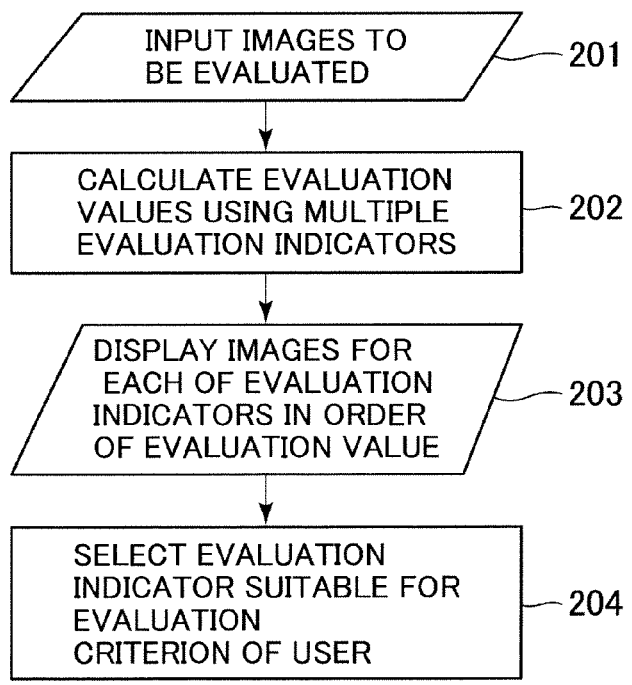
FIG. 2 is a flowchart of operations according to an embodiment of the present invention, while the flowchart illustrates procedures of calculating an evaluation value using a plurality of evaluation indicators and selecting an evaluation indicator that is suitable for an evaluation criterion of a user.

FIG. 2 is a flowchart of procedures of selecting an evaluation indicator that is closest to an evaluation indicator of a user.

In this case, examples of the evaluation indicator are the area of a difference between an image to be observed and a reference image, the number of defects that is calculated from the area of the difference, a correlation value obtained by comparing the image to be observed with the reference image, the size, shape and color of a specific pattern in the image to be observed, a distance between specific patterns, and the like.

Referring to FIG. 2, a plurality of images to be evaluated are input (in step 201). An evaluation value is calculated using a plurality of evaluation indicators for each of the input images to be evaluated (in step S202). In this case, when a function of enabling a user to select evaluation indicators to be used for the evaluation exists, and the user has a certain amount of experience, the user can narrow the evaluation indicators. Thus, it is possible to reduce a time period for a process of calculating the evaluation values. Results of the evaluation are displayed as images arranged for each of the evaluation indicators in order of evaluation value (in step 203). The user can confirm the images displayed in order of evaluation value and easily select an evaluation indicator that is expected to be optimal (in step S204).

Figure 3:
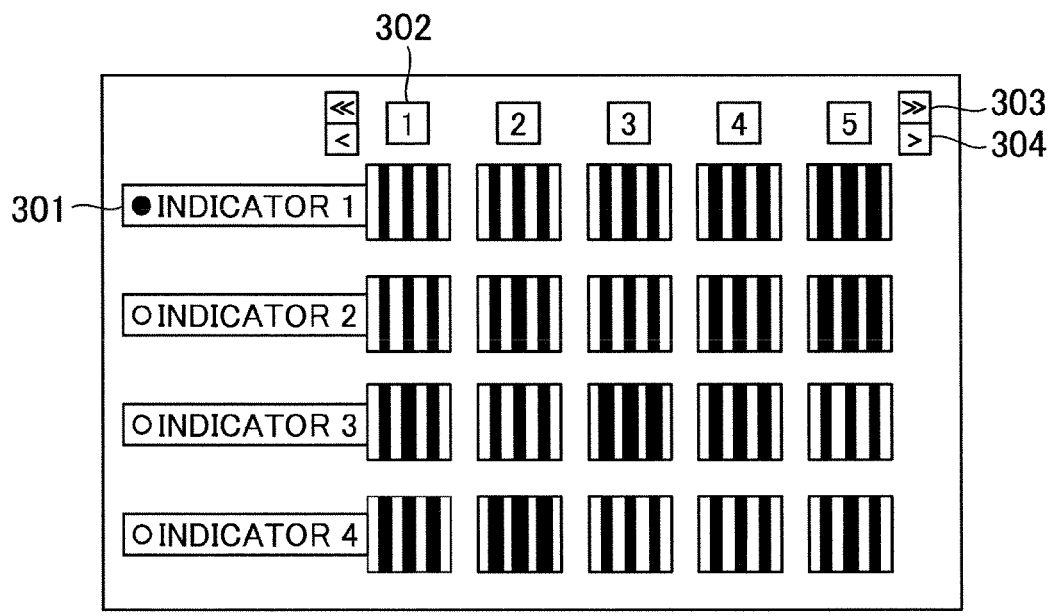
FIG. 3 is a diagram illustrating an example of a GUI according to the embodiment of the present invention, while a list of images is displayed for each of a plurality of evaluation indicators so that the images are arranged in order of evaluation value in the example.

FIG. 3 is a diagram illustrating an example of a GUI in which a list of the results of the evaluation performed using the plurality of evaluation indicators is displayed. In FIG. 3, the results of the evaluation performed using four types of evaluation indicators are displayed, while the evaluation indicators are indicators 1 to 4. Selecting a radio button 301 of any of the indicators 1 to 4 selects a single interested indicator.

Consecutive numbers 302 are assigned to the plurality of images (to be evaluated) in ascending or descending order of evaluation values calculated on the basis of the evaluation indicators and are displayed. A scroll button 303 for scrolling on a page basis and a scroll button 304 for scrolling on an image basis are arranged to easily confirm if the evaluation indicators are good or bad.

Figure 4:
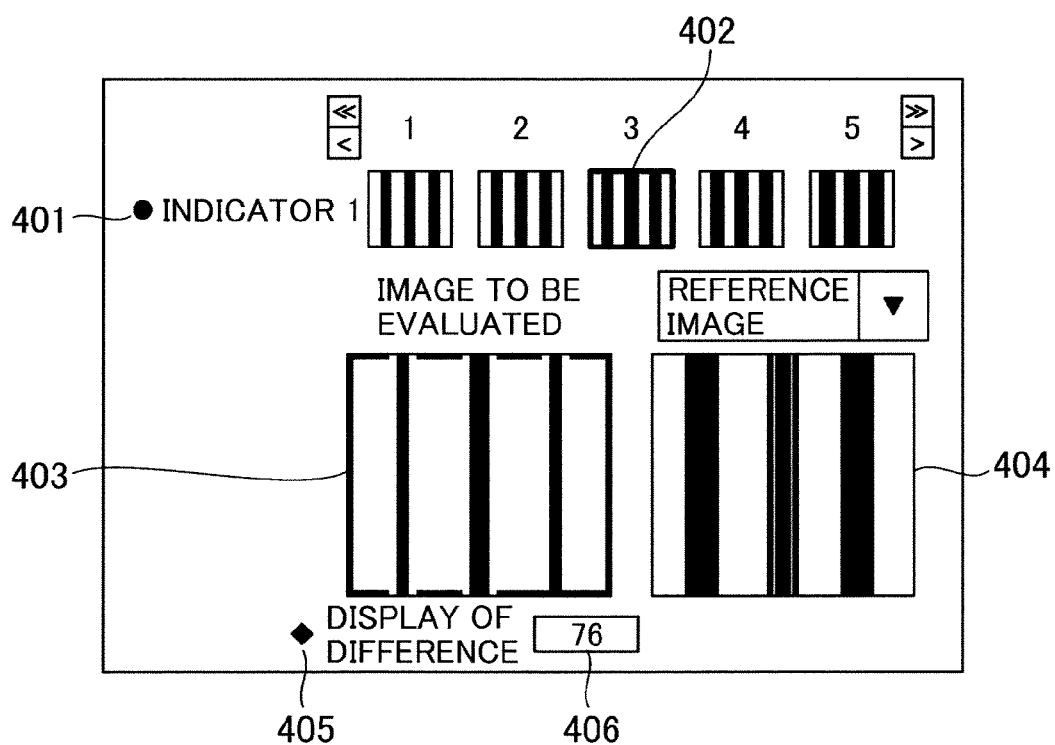
FIG. 4 is a diagram illustrating an example of a GUI according to the embodiment of the present invention, while images are displayed for an interested evaluation indicator in order of evaluation value, and detailed information on a selected image, especially, a reference image, is displayed in the example.

FIG. 4 is a diagram illustrating an example of a GUI that is used to confirm an interested evaluation indicator and detailed contents of an evaluation. In FIG. 4, images are rearranged in order of evaluation value calculated on the basis of the interested evaluation indicator and are displayed in a screen region 401. An image 402 selected from thumbnail images is enlarged and displayed as an enlarged image 403. A reference image 404 is displayed so that the reference image 404 and the enlarged image 403 are arranged side-by-side.

The reference image 404 is an image that is also called a golden image. In general, the reference image 404 and the image 403 to be evaluated are compared with each other and a difference between the reference image 404 and the image 403 to be evaluated is extracted. An evaluation value is calculated from the difference. The difference is overlaid and displayed on the image to be evaluated, while a displayed color of the difference is changed, for example. Thus, the difference between the reference image 404 and the image 403 to be evaluated can be clearly determined. Reference numeral 405 indicates the display of the difference, while reference numeral 406 indicates the evaluation value. Since the evaluation value is displayed, the validity of the evaluation indicator can be confirmed in detail (the evaluation value is 76 in the example illustrated in FIG. 4).

Figure 5:
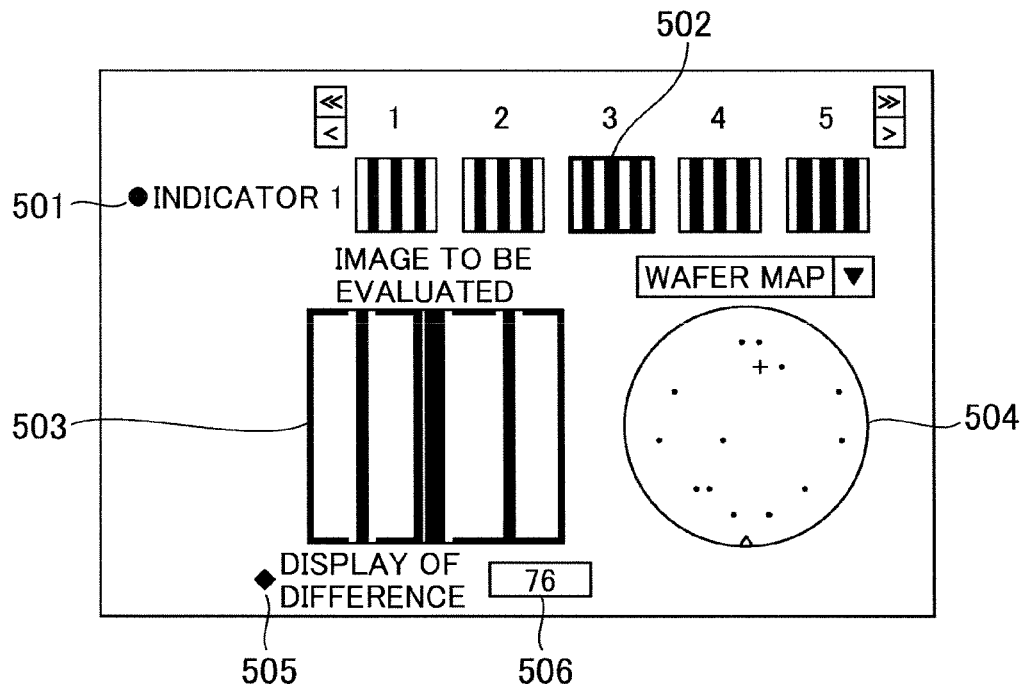
FIG. 5 is a diagram illustrating an example of the GUI according to the embodiment of the present invention, while images are displayed for an interested evaluation indicator in order of evaluation value, and detailed information on a selected image, especially, a wafer map, is displayed in the example.

FIG. 5 is a diagram illustrating an example of the GUI that is used to confirm the interested evaluation indicator and the detailed contents of the evaluation. In FIG. 5, images are rearranged in order of evaluation value calculated on the basis of the interested evaluation indicator and are displayed in a screen region 501. An image 502 selected from thumbnail images is enlarged and displayed as an enlarged image 503. A difference between the selected image and the reference image is overlaid and displayed in the vicinity of the enlarged and displayed image 503 (a display 505 of the difference), while a displayed color of the difference is changed, for example. In addition, when an evaluation value 506 of the selected image is recognized, the evaluation value 506 is useful as detailed information for a selection of an indicator. In addition, a wafer map 504 is displayed so that the position of the selected image on a wafer can be confirmed.

Figure 6:
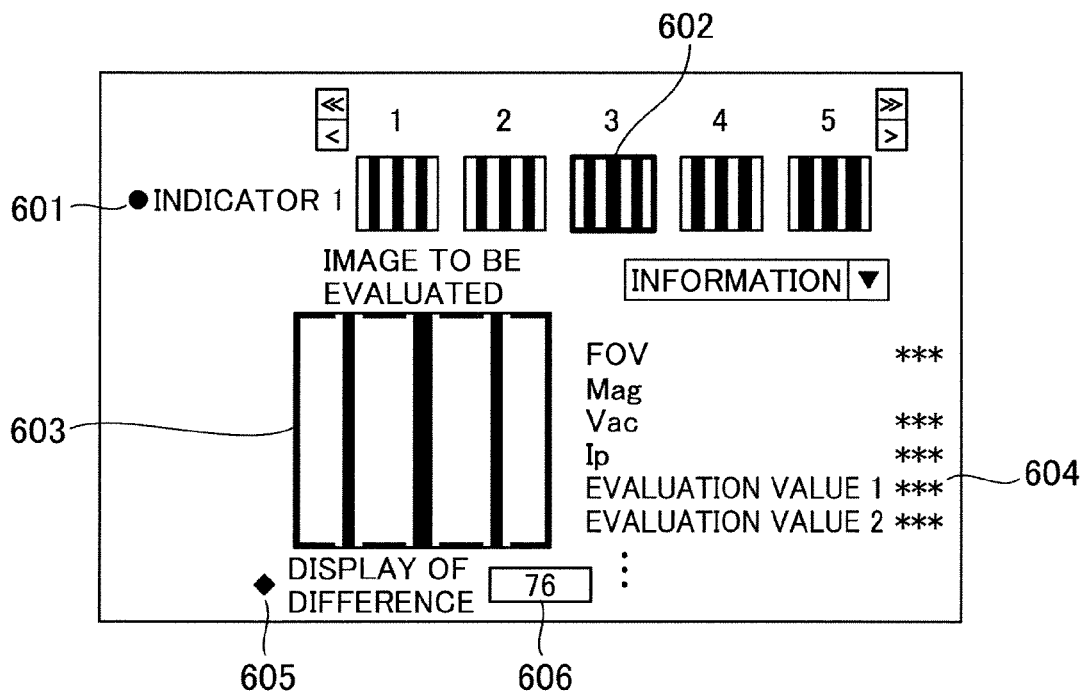
FIG. 6 is a diagram illustrating an example of the GUI according to the embodiment of the present invention, while images are displayed for an interested evaluation indicator in order of evaluation value, and detailed information on a selected image, especially, an imaging condition, is displayed in the example.

FIG. 6 is a diagram illustrating an example of the GUI that is used to confirm the interested evaluation indicator and the detailed contents of the evaluation. In FIG. 6, images are rearranged in order of evaluation value calculated on the basis of the interested evaluation indicator and are displayed in a screen region 601. An image 602 selected from thumbnail images is enlarged and displayed as an enlarged image 603. A difference between the selected image and the reference image is overlaid and displayed in the vicinity of the enlarged and displayed image 603 (a display 605 of the difference), while a displayed color of the difference is changed, for example. In addition, when an evaluation value 606 of the selected image is recognized, the evaluation value 606 is useful as detailed information for a selection of an indicator. In addition, conditions (such as a field of view (FOV) (size of the field of view), magnification (Mag), an acceleration voltage (Vac), a probe current (Ip), an evaluation value 1 (evaluation value for the evaluation indicator 1), and an evaluation value 2 (evaluation value for the evaluation indicator 2)) for acquiring the image to be evaluated are displayed as information 604 so that analysis can be performed in detail.

FIG. 7 is a flowchart of procedures of selecting an evaluation indicator that is closest to an evaluation indicator required by the user, in which sampling is performed so that a time period for a process of calculating an evaluation value is reduced.

In FIG. 7, a plurality of images to be evaluated are first input (in step 701). Next, images that are to be evaluated using a plurality of evaluation indicators are selected (in step 702). Evaluation values are calculated using the plurality of evaluation indicators for results of sampling (in step 703). The images for which the evaluation values are calculated are rearranged for each of the evaluation indicators in order of evaluation value and are displayed as a list (in step 704). An evaluation indicator that is closest to the evaluation indicator of the user is selected from the list of the images arranged for each of the evaluation indicators in order of evaluation value (in step 705).

As described above, the evaluation values are not calculated for all the input images using the plurality of evaluation indicators. Since the images are limited to the images that are to be evaluated and are representative images, the time period for the process of calculating the evaluation values can be reduced. In addition, when a function of enabling the user to select evaluation indicators to be used for the evaluation is provided, and the user has a certain amount of experience, the user can narrow the evaluation indicators. Thus, the time period for the process of calculating the evaluation values can be significantly reduced.

When the results that are obtained by limiting the images to the images to be evaluated are not reliable, evaluation values are calculated for all the input images (in step 706), and the images can be rearranged and displayed in order of evaluation value (in step 707). In this case, since the evaluation values are calculated using the selected single evaluation indicator, the time period for the process can be reduced compared with the case in which the sampling is not performed.

FIG. 8 is a conceptual diagram illustrating the sampling in which a number M (equal to or smaller than N) of images 802 to be evaluated are selected from among a number N of all input images 801. The images to be sampled may be selected by the user, or the images may be automatically sampled.

When the sampling is to be automatically performed, random sampling may be performed. However, when images that are expected to be more representative are SEM images and are to be selected, a sampling algorithm is set to a suitable sampling algorithm so that the accuracy in evaluation results can be improved using a necessary minimum number of samples. For example, the sampling algorithm is set to the suitable sampling algorithm so that a histogram distribution of luminescence values is calculated, or images in which differences exist in distributions are selected, or the like. However, when it takes an excessively long time to perform analysis for the sampling, the effect of a reduction (that is the original purpose) in the time period is reduced. Thus, it is necessary to pay attention to the balance.

FIG. 9 is a flowchart of procedures of rearranging images on the basis of an evaluation criterion desired by the user, defining an optimal evaluation criterion indicator in advance, and automatically selecting an evaluation criterion (evaluation indicator) that is closest to the defined evaluation criterion indicator.

Figure 10:
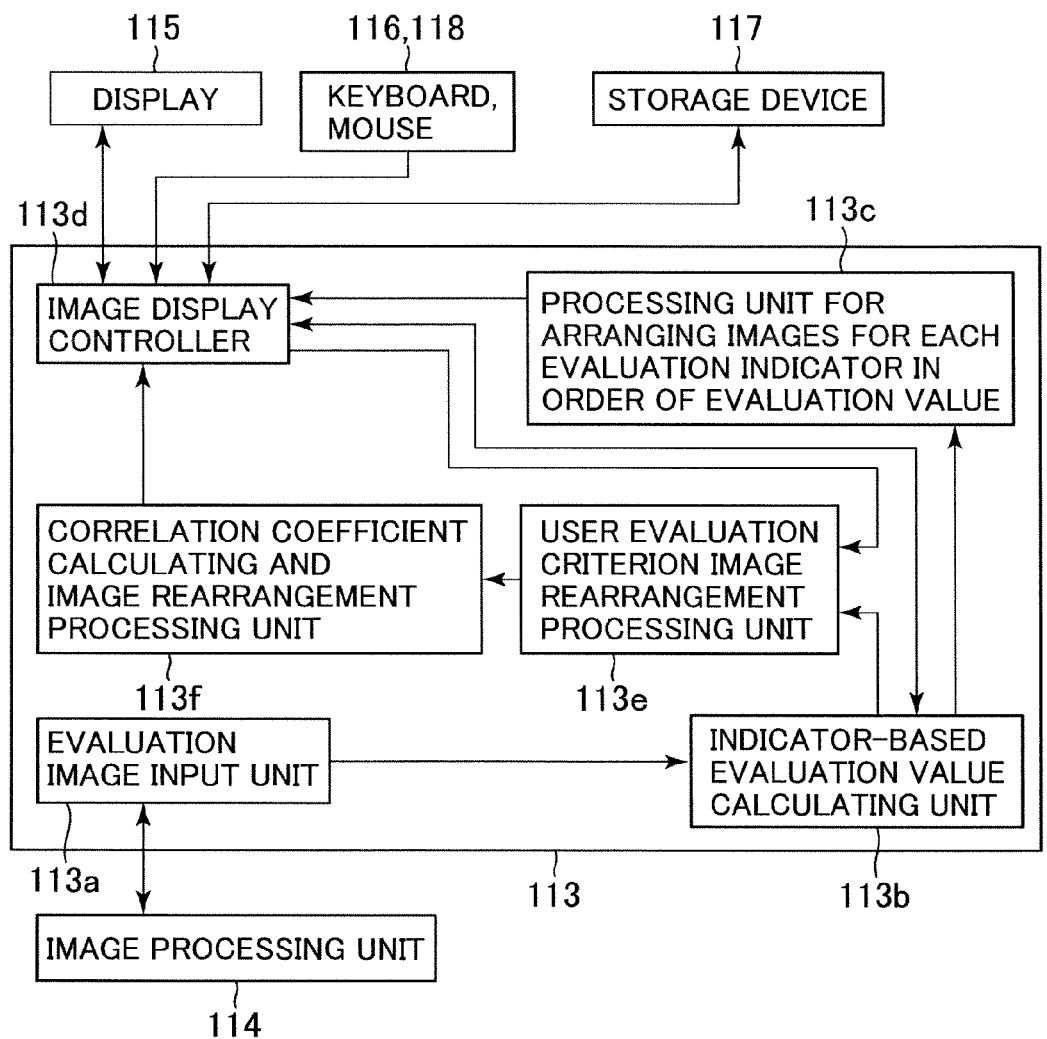
FIG. 10 is a block diagram illustrating internal functions of a whole controller according to the embodiment of the present invention.

In addition, FIG. 10 is a block diagram illustrating internal functions of the whole controller 113 that performs operations of the flowchart illustrated in FIG. 9.

Referring to FIGS. 9 and 10, a plurality of images to be evaluated are input from the image processing unit 114 to an evaluation image input unit 113a (in step 901). Next, the input images to be evaluated are displayed on the display 115 through an indicator-based evaluation value calculating unit 113b and an image display controller 113d.

Subsequently, the user uses the keyboard 116, the mouse 118 or the like, rearranges the images (to be evaluated) on the basis of an evaluation criterion of the user while referencing the display 115, and thereby defines an evaluation criterion (in step 902). The definition is input from the keyboard 116 or the mouse 118 to the indicator-based evaluation value calculating unit 113b through the image display controller 113d.

Next, the indicator-based evaluation value calculating unit 113b calculates evaluation values for the input images (to be evaluated) using a plurality of evaluation indicators (in step 903). Then, a user evaluation criterion image rearrangement processing unit 113e and a correlation coefficient calculating and image rearrangement processing unit 113f compares the evaluation indicators with the evaluation criterion defined by the user and, for example, calculates correlation coefficients (in step 904). Then, the user evaluation criterion image rearrangement processing unit 113e and the correlation coefficient calculating and image rearrangement processing unit 113f automatically select, as the closest evaluation criterion, an evaluation indicator having the maximum absolute value of a correlation coefficient between the evaluation indicator and the evaluation criterion defined by the user (in step 905).

Each of the correlation coefficients is calculated from the following Equation (1), where a data string arranged in order of evaluation criterion defined by the user is x; the average value of data strings x is x with a bar; a data string rearranged in order of evaluation value for an evaluation indicator is y; and the average value of data strings y is y with a bar.

$$\rho_{x,y} = \frac{\sum_{i=1}^{n}(x_i - \bar{x})(y_i - \bar{y})}{\sqrt{\sum_{i=1}^{n}(x_i - \bar{x})^2}\sqrt{\sum_{i=1}^{n}(y_i - \bar{y})^2}}$$

Equation 1

In addition, the images are rearranged in order of correlation coefficient by the correlation coefficient calculating and image rearrangement processing unit 113f, and a list of the images is displayed on the display 115 through the image display controller 113d so that the images are arranged in order of evaluation value (in step 906). This display is effective to evaluate and confirm the validity of the result of the automatic selection.

A processing unit 113c for arranging images for each evaluation indicator in order of evaluation value is a processing unit for performing image display illustrated in FIG. 3.

Figure 11:
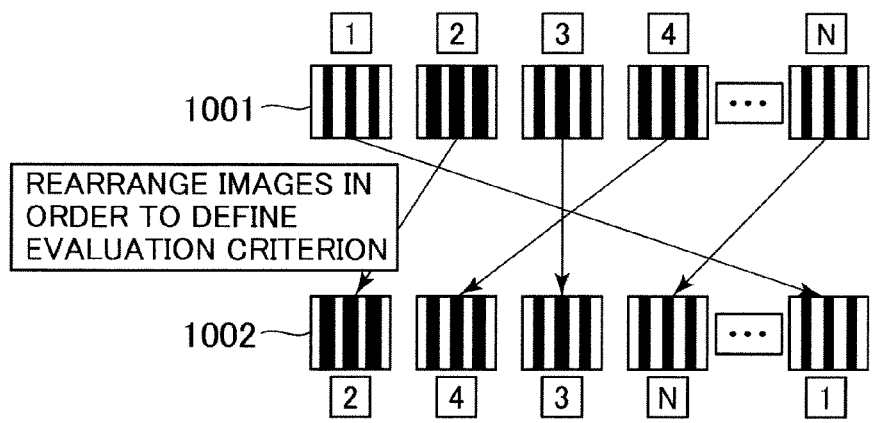
FIG. 11 is a diagram illustrating procedures of rearranging images and defining the evaluation criterion.

FIG. 11 is a diagram illustrating procedures of rearranging a plurality of images and thereby defining an evaluation criterion required by the user. In FIG. 11, a plurality of input images 1001 are rearranged in accordance with the evaluation criterion of the user, for example, in order of quality of wiring patterns that exist in a field of view for observation (the rearranged images are indicated by reference numeral 1002).

The example illustrated in FIG. 11 is a relatively simple case. It is difficult for a conventional length measurement SEM to comprehensively evaluate the widths of wiring patterns. Especially, when a wiring pattern is completely broken, a measured length cannot be calculated. The conventional length measurement SEM is suitable to calculate a measured length in an accurate and highly reproducible manner when a variation is in a limited range. However, the conventional length measurement SEM is not suitable to comprehensively evaluate quality in the field of view for observation.

Figure 12:
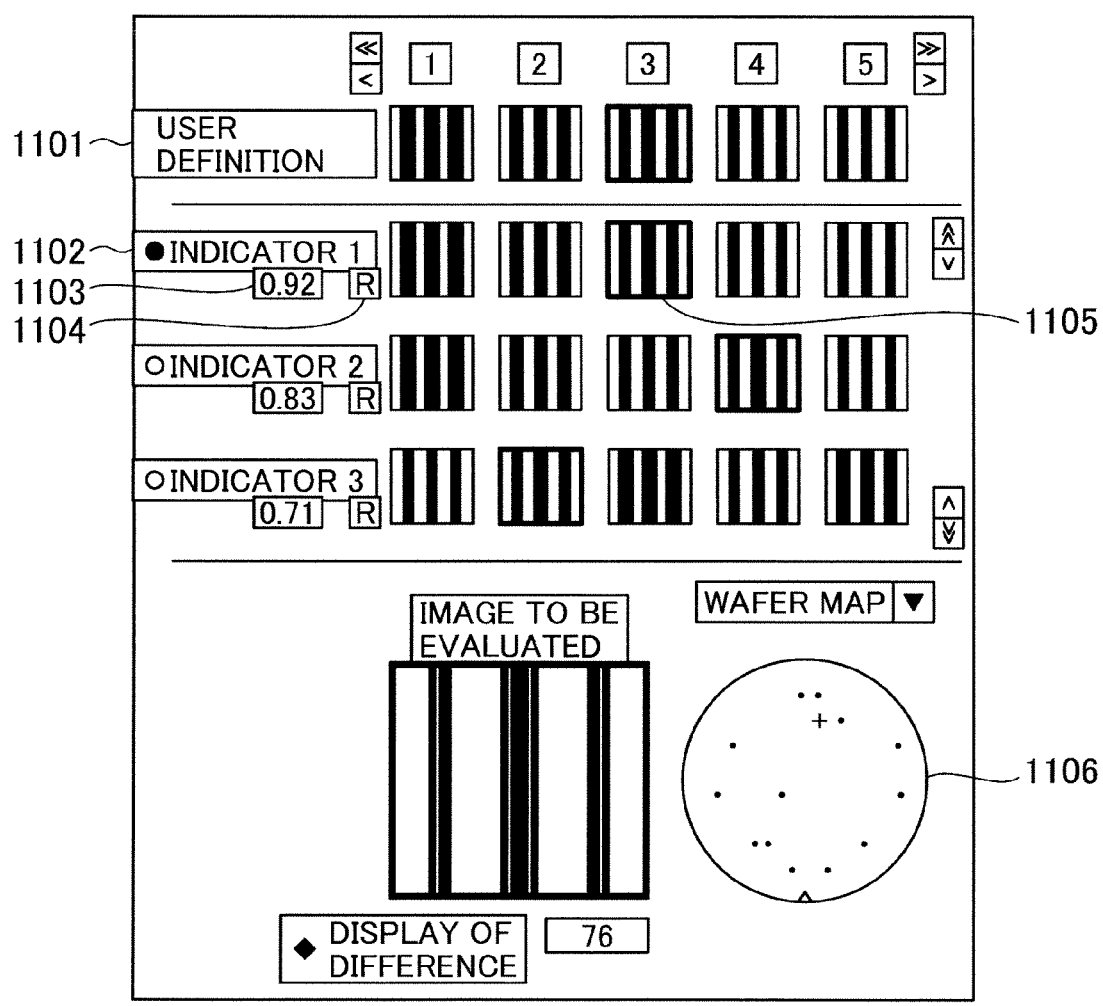
FIG. 12 is an example of a GUI according to the embodiment of the present invention, while the evaluation criterion defined by the user, results of evaluations performed using evaluation indicators, and detailed contents of images evaluated using the evaluation indicators, can be confirmed in the example.

FIG. 12 is a diagram illustrating an example of a GUI that is used to confirm an evaluation criterion defined by the user as described with reference to FIG. 11, evaluation results obtained for each of evaluation indicators, detailed contents of images evaluated for each of the evaluation indicators.

In FIG. 12, a plurality of images 1101 that are rearranged on the basis of the definition of the user are displayed. Evaluation values are calculated for a plurality of evaluation indicators 1 to 3. A plurality of images 1102 are displayed for each of the indicators in order of evaluation value. The plurality of evaluation indicators are displayed in descending order of absolute value of a correlation coefficient between the evaluation indicator and the evaluation criterion of the user. For each of the indicators, a correlation coefficient 1103 between the evaluation indicator and the evaluation criterion of the user is displayed with the indicator.

If the correlations with the definition of the user are strongly negative, the display order of the images is reversed so that the images can be easily compared. Thus, a button 104 for reversing the display order is provided. In addition, a selected image 1105 is highlighted and displayed. An image formed by enlarging the selected image 1105, a reference image, a difference between the selected image 1105 and the reference image, an evaluation value, a wafer map 1106, information on image acquiring conditions, and the like, are displayed.

Figure 13:
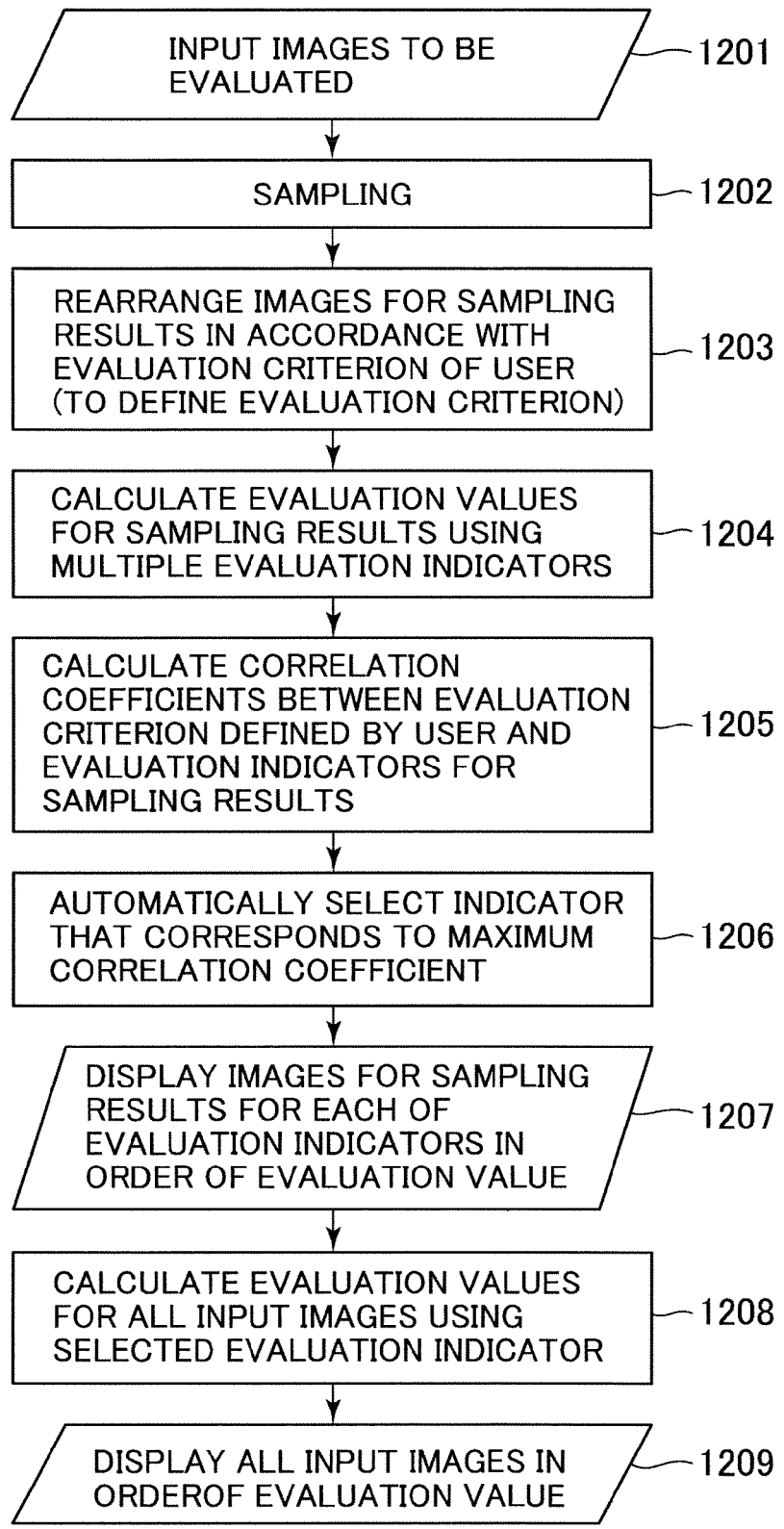
FIG. 13 is a flowchart of operations according to the embodiment of the present invention, while the flowchart illustrates procedures of rearranging images, defining an evaluation criterion, and automatically selecting an evaluation indicator that is closest to the defined evaluation criterion, in which sampling is performed to limit images to be evaluated so that an operation of setting the evaluation criterion and a time period for a process of calculating an evaluation value can be reduced.

FIG. 13 illustrates a modified example of the flowchart illustrated in FIG. 9 and is a flowchart of procedures of automatically selecting an evaluation criterion that is closest to the evaluation criterion defined by the user. In the procedures illustrated in the flowchart, input images are sampled so that a time and effort of defining an evaluation criterion and a time period for a process of calculating evaluation values are reduced.

First, images to be evaluated are input (in step 1201). Next, images that are to be evaluated using a plurality of evaluation indicators are sampled (in step 1202). The images can be automatically sampled by the evaluation image input unit 113a and can be sampled by a user operation.

The sampled images are rearranged to define an evaluation criterion (in step 1203). In addition, evaluation values are calculated for the sampled images using the plurality of evaluation indicators (in step 1204, the indicator-based evaluation value calculating unit 113b). In addition, correlation coefficients between the evaluation criterion defined by the user and the evaluation indicators are calculated for the sampled images (in step 1205, the processing units 113e and 113f). An indicator having the maximum absolute value of the correlation coefficient is automatically selected as a recommended indicator (in step 1206, the processing unit 113f). Images for which the evaluation values are calculated are arranged for each of the evaluation indicators in order of evaluation value, and a list of the images is displayed (in step 1207, the controller 113d and the display 115).

As described above, the evaluation values are not calculated for all the input images using the plurality of evaluation indicators. Since the images are limited to the images that are to be evaluated and are representative images, the time period for the process of calculating the evaluation values can be reduced. In addition, when a function of enabling the user to select evaluation indicators to be used for the evaluation is provided, and the user has a certain amount of experience, the user can narrow the evaluation indicators. Thus, the time period for the process of calculating the evaluation values can be significantly reduced.

When results that are obtained by limiting the images to the images to be evaluated are not reliable, evaluation values can be calculated for all the input images (in step 1208), and the images can be rearranged and displayed in order of evaluation value (in step 1209). In this case, since the evaluation values are calculated only using the selected single evaluation indicator, the time period for the process can be reduced compared with the case in which the sampling is not performed.

Figure 14:
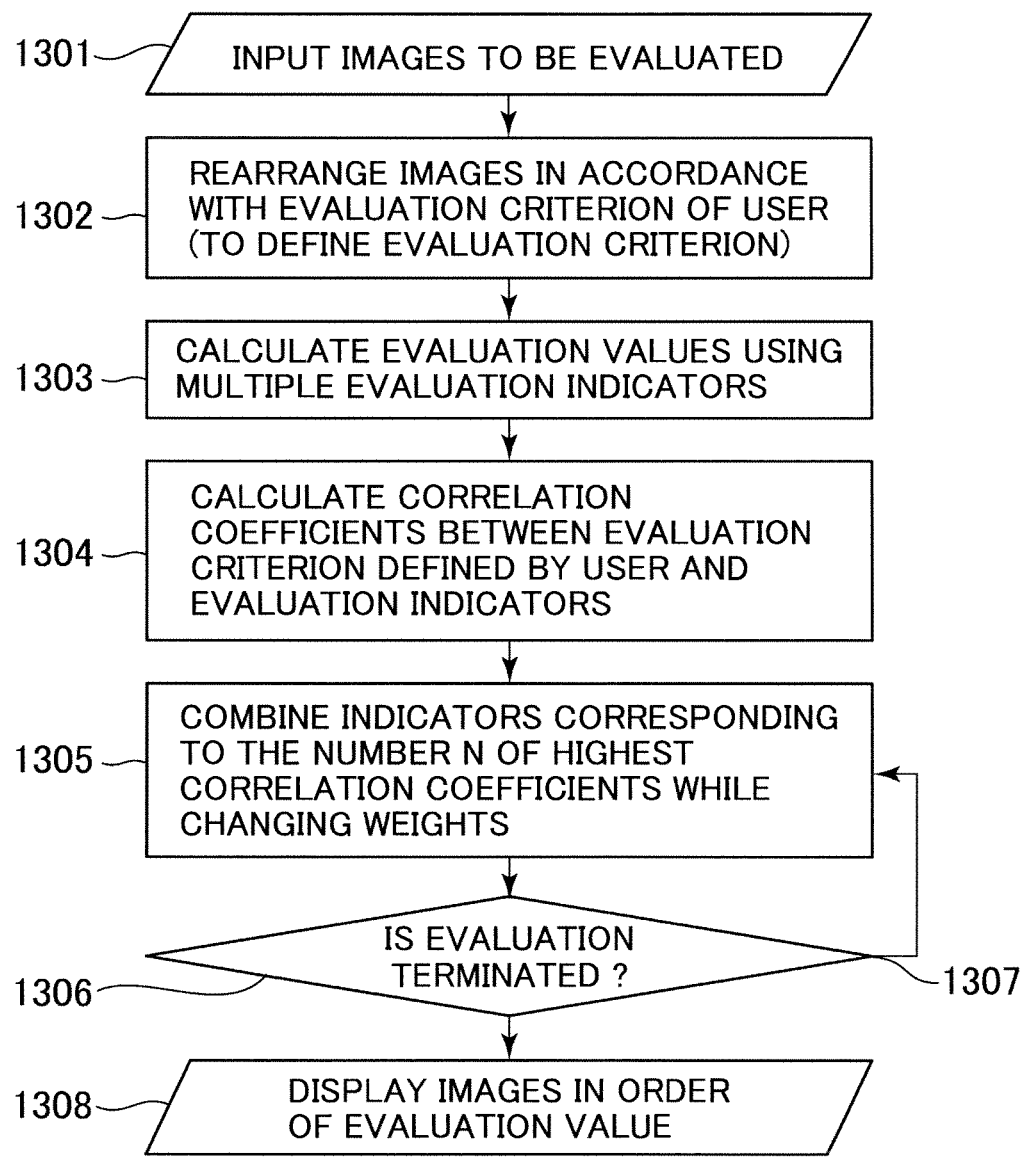
FIG. 14 is a flowchart of operations according to the embodiment of the present invention, while the flowchart illustrates an operation of combining existing evaluation indicators to generate a new evaluation indicator.

FIG. 14 illustrates a modified example of the flowchart illustrated in FIG. 9 and is a flowchart of procedures of combining existing evaluation indicators to generate a new evaluation indicator. In FIG. 14, images to be evaluated are first input (in step 1301). Next, the images are rearranged in accordance with the evaluation criterion of the user, and thereby, a classification criterion is defined (in step 1302). Evaluation values are calculated for the input images using a plurality of evaluation indicators (in step 1303). Subsequently, correlation coefficients between the evaluation criterion defined by the user and the evaluation indicators are calculated (in step 1304).

The correlation coefficient calculating and image rearrangement processing unit 113f combines a number N of indicators that correspond to the number N of the highest absolute values of the correlation coefficients between the evaluation criterion and the indicators, and thereby generates a new evaluation indicator (in step 1305) so as to evaluate correlation coefficients obtained when weights are changed. For example, when the absolute value of the correlation coefficient of the combined evaluation indicator is equal to or larger than a certain threshold value, it is determined that the generated evaluation indicator is effective. An evaluation indicator having the maximum absolute value of a correlation coefficient is then selected, and the process is terminated. When the absolute value of the correlation coefficient of the combined evaluation indicator is smaller than the absolute value of a correlation coefficient of an existing independent evaluation indicator, it is determined that the evaluation indicator that has been generated by the combination is not effective. An evaluation indicator having the maximum absolute value of the correlation coefficient is then selected from among the existing independent evaluation indicators, and the process is terminated (in step 1306).

When the absolute value of the correlation coefficient of the combined evaluation indicator is among the number N of the highest absolute values of the correlation coefficients selected in step 1305, the evaluation may be continuously performed to seek a possibility of generating the optimal combined indicator (in step 1307). A list of the images is displayed so that the images are arranged for each of the evaluation indicators in order of evaluation value, and thereby, the validity of the selected evaluation indicator can be easily confirmed by displaying a list of the images (in step 1308).

FIG. 15 is a diagram illustrating an example of a GUI that is used to set and confirm the combined evaluation indicator. Equations for combining the evaluation indicators are expressed as the following Equations (2), where f is the combined evaluation indicator, g is an independent evaluation indicator, w is a weight to be applied to the independent evaluation indicator, and c is a constant number. The following Equations (2) are expected to be simplest and are represented for the description. Equations (2) may be different equations.

$$\begin{cases} f = \sum_{i=1}^{n} w_i g_i \\ \sum_{i=1}^{n} w_i = c \end{cases} \quad \text{Equations 2}$$

In FIG. 15, evaluation indicators to be combined are selected (numbers 1401 of the indicators are selected). As independent evaluation indicators, the following (indicator names 1402) can be considered: the area of a difference between a reference image and an image to be evaluated; the number of defects that is calculated from results of grouping the differences; and a distance between specific patterns that are effective for evaluation of the accuracy in alignment. When the images are SEM images, pixels are each represented using a gray scale. Thus, as the independent evaluation indicators, the following (indicator names 1402) can also be considered: a luminescence distribution representing a gray scale distribution; a measured length that is used for a length measurement SEM; the degree of circularity when a hole-shaped pattern or the like is assumed to be present; edge roughness when a line pattern is assumed to be present; the number of disconnected patterns; the number of short-circuited patterns; and the like.

As a selection criterion, correlation coefficients of independent evaluation indicators can be considered. Thus, a sort function is useful when the sort function is provided (correlation coefficients 1403). When evaluation indicators to be combined are to be automatically selected, the evaluation indicators are selected in descending order of an evaluation indicator having the larger absolute value of the correlation coefficient of the independent evaluation indicator. Weights can be manually and finely adjusted (weights 1404).

When an indicator is to be automatically selected, multiple evaluation indicators are combined to form a combined evaluation indicator, and an evaluation indicator having the maximum absolute value of a correlation coefficient is selected therefrom. In this case, the time period for the process of calculating correlation coefficients can be reduced using design of experiments or the like. Results that are obtained when the weight is changed can be stored as memo information (memo information 1405).

In such a manner, experience in evaluating a relationship between an evaluation indicator name and a correlation coefficient obtained when weight is changed, is accumulated. The accuracy in estimating which evaluation indicator is effective for a sample to be evaluated can, therefore, be improved. When the accuracy of the estimation is improved, the accuracy of selecting an evaluation indicator is improved. Thus, a process of performing an evaluation using an unnecessary evaluation indicator can be eliminated.

Figure 16:
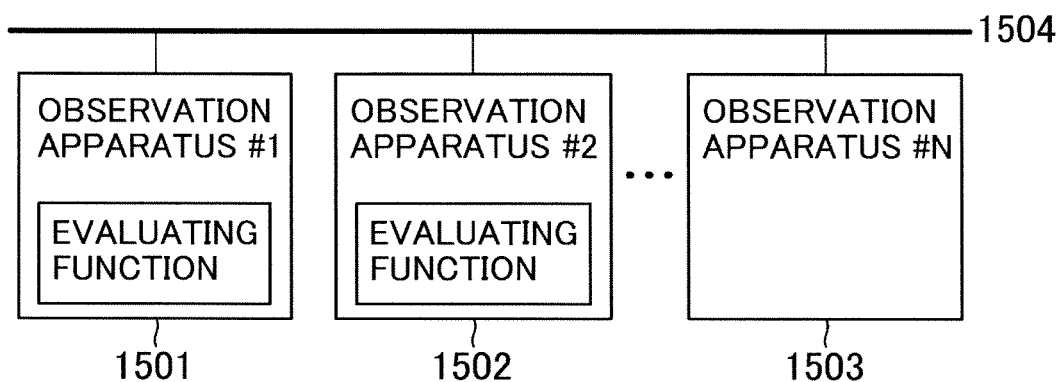
FIG. 16 is a diagram illustrating an example of a network system in which a plurality of surface observation apparatuses are connected to each other through a network according to the embodiment of the present invention.
Figure 17:
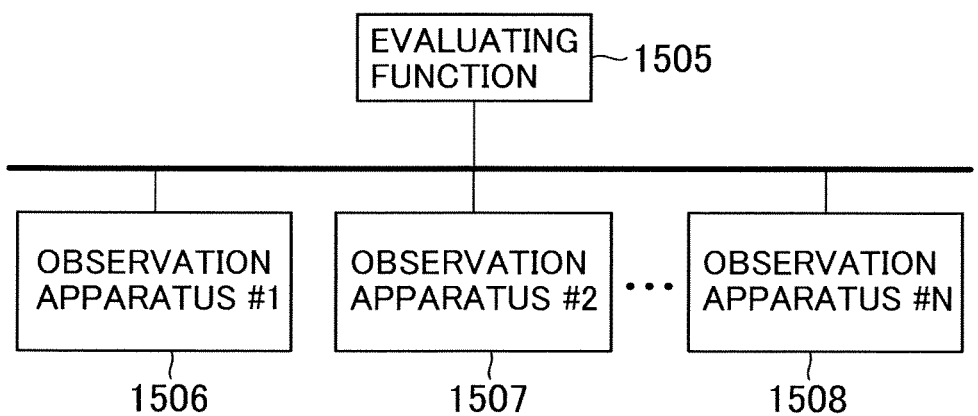
FIG. 17 is a diagram illustrating another example of a network system in which a plurality of surface observation apparatuses are connected to each other through a network according to the embodiment of the present invention.

FIG. 16 is a diagram illustrating an observation system in which a plurality of the observation apparatuses according to the present invention, some of which have an evaluating function, are connected to a network. FIG. 17 is a diagram illustrating an observation system in which a plurality of the observation apparatuses according to the present invention are connected to a network.

Referring to FIG. 16, the surface observation apparatuses each have a signal transmitting/receiving unit that transmits and receives information. The plurality of observation apparatuses (1501, 1502, 1503) are connected to the network 1504 through the signal transmitting/receiving units of the observation apparatuses. The network 1504 may be a wired or wireless network as long as data can be transmitted and received among the observation apparatuses through the network 1504.

The observation apparatus 1503 does not have a quality evaluating function. Thus, a quality cannot be evaluated by the observation apparatus 1503. However, an image that is to be evaluated and is stored in the observation apparatus 1503 can be evaluated using a recipe analyzing function of the observation apparatus 1501 or 1502.

FIG. 17 illustrates the observation system in which the observation apparatuses do not have a quality evaluating function and a quality management server 1505 performs central management. An image to be evaluated is centrally managed by the quality management server. The quality management server can transfer the image to be evaluated to the observation apparatuses (1506, 1507, 1508) when necessary.

According to the embodiment of the present invention, as described above, surface images of multiple parts of a surface of a sample to be evaluated are evaluated using a plurality of evaluation indicators, the images to be evaluated are arranged and displayed for each of the indicators in order of evaluation value. Correlation coefficients between an evaluation criterion that is determined in accordance with an arrangement of multiple images arranged by the user and the evaluation indicators are automatically calculated for a plurality of images. Then, an evaluation indicator that has the maximum correlation coefficient among the calculated correlation coefficients is detected and displayed on the screen.

Thus, an evaluation indicator that is closest to an evaluation criterion desired by the user and among a plurality of evaluation indicators stored in the surface observation apparatus is automatically detected. Therefore, the surface observation apparatus and the surface observation method can be achieved, which enable even a beginner to easily select the optimal evaluation indicator for each of various patterns to be evaluated without a trial and error approach.

DESCRIPTION OF THE REFERENCE NUMERALS

101 . . . Electron gun, 102 . . . Lens, 103 . . . Deflector, 104 . . . Objective lens, 105 . . . Sample, 106 . . . Stage, 107 . . . Electron beam, 108 . . . Secondary particle, 109 . . . Secondary particle detector, 110 . . . Electronic optical system controller, 111 . . . A/D converter, 112 . . . Stage controller, 113 . . . Whole controller, 113*a* . . . Evaluation image input unit, 113*b* . . . Indicator-based evaluation value calculating unit, 113*c* . . . Processing unit for arranging images for each evaluation indicator in order of evaluation value, 113*d* . . . Image display controller, 113*e* . . . User evaluation criterion image rearrangement processing unit, 113*f* . . . Correlation coefficient calculating and image rearrangement processing unit, 114 . . . Image processing unit, 115 . . . Display, 116 . . . Keyboard, 117 . . . Storage device, 118 . . . Mouse, 1501, 1502 . . . Observation apparatus with evaluating function, 1503, 1506, 1507, 1508 . . . Observation apparatus without evaluating function, 1504 . . . Network, 1505 . . . Evaluating function

The invention claimed is:

1. An observation apparatus that observes a sample, comprising:
   an image acquiring unit that acquires a plurality of images of a plurality of parts of the sample;
   an image processing unit that receives the plurality of images acquired by the image acquiring unit and processes the received plurality of images;
   a display unit that displays a plurality of processed images processed by the image processing unit;
   an input unit for rearranging the plurality of processed images displayed on the display unit in response to an input of a user; and
   a controller including an indicator-based evaluation value calculating unit that calculates an evaluation value for each of the plurality of processed images in accordance with a plurality of evaluation indicators, wherein:
   the controller compares an evaluation criterion corresponding to an order of the plurality of processed images rearranged by the input unit with each of the plurality of evaluation indicators to evaluate whether each of the plurality of evaluation indicators is right or wrong, and
   the controller combines the plurality of evaluation indicators having large correlation coefficients among evaluation criterion corresponding to the order of the plurality of processed images rearranged by the input unit, generates a combined evaluation indicator, calculates a correlation coefficient between the generated combined evaluation indicator and the evaluation criterion, compares, on the basis of the calculated correlation coefficient, the generated combined evaluation indicator with the selected evaluation indicator having the maximum correlation coefficient, and selects an evaluation indicator having a larger correlation coefficient.

2. The observation apparatus according to claim 1, wherein the image processing unit automatically samples an image that is to be observed among the plurality of images acquired by the image acquiring unit.

3. The observation apparatus according to claim 1,
wherein the display unit displays, on the screen, the evaluation criterion, the plurality of processed images arranged in accordance with the evaluation criterion, the evaluation indicators, the plurality of processed images arranged in accordance with the evaluation indicators, an enlarged image of an image that is selected as an image to be evaluated among the plurality of processed images, an enlarged image of a reference image, a wafer map, and at least one of imaging conditions for the images.

4. The observation apparatus according to claim 1,
wherein the display unit displays, on the screen, two or more of a numerical value indicating a similarity between the order of the plurality of processed images arranged on the basis of the defined evaluation criterion and the order of the plurality of processed images arranged on the basis of each of the plurality of evaluation indicators, a value indicating weight to be multiplied by each of the evaluation indicators to combine a plurality of evaluation indicators, and a numerical value indicating a similarity between orders of the plurality of processed images arranged on the basis of the combined evaluation indicator.

5. The observation apparatus according to claim 1,
wherein the sample is a semiconductor.

6. An observation system comprising:
a plurality of the observation apparatuses according to claim 1 connected to an information network through signal transmitting/receiving units, which transmit and receive a signal, of the plurality of the observation.

7. A method for observing a sample, comprising the steps of:
acquiring images of a plurality of parts of the sample;
performing image processing on the acquired images;
displaying the processed images;
rearranging the displayed images in response to an input of a user;
obtaining an evaluation value for each of the displayed images in accordance with a plurality of evaluation indicators;
comparing an evaluation criterion corresponding to an order of the displayed images rearranged by the user with each of the plurality of evaluation indicators to evaluate whether each of the plurality of evaluation indicators is right or wrong;
combining the plurality of evaluation indicators having large correlation coefficients among the evaluation criterion corresponding to the order of the displayed images rearranged by the user to generate a combined evaluation indicator;
calculating a correlation coefficient between the generated combined evaluation indicator and the evaluation criterion;
comparing, on the basis of the calculated correlation coefficient, the generated combined evaluation indicator with the selected evaluation indicator having the maximum correlation coefficient; and
selecting an evaluation indicator having a larger correlation coefficient.

8. The method according to claim 7,
wherein an image that is to be observed among the acquired images, is automatically sampled.

9. The method according to claim 7, further comprising the step of causing a display unit to display, on the screen, the evaluation criterion, the processed images arranged in accordance with the evaluation criterion, the evaluation indicators, the processed images arranged in accordance with the evaluation indicators, an enlarged image of an image that is selected as an image to be evaluated among the processed images, an enlarged image of a reference image, a wafer map, and at least one of imaging conditions for the images.

10. The method according to claim 7, further comprising the step of causing a display unit to display, on the screen, two or more of a numerical value indicating a similarity between the order of observation images arranged on the basis of the defined evaluation criterion and the order of observation images arranged on the basis of each of the plurality of evaluation indicators, a value indicating weight to be multiplied by each of the evaluation indicators to combine a plurality of evaluation indicators, a numerical value indicating a similarity between orders of observation images arranged on the basis of the combined evaluation indicator.

11. The method according to claim 7,
wherein the sample is a semiconductor.

12. An observation apparatus that observes a surface of a sample, comprising:
an image acquiring unit that acquires surface images of a plurality of parts on the surface of the sample;
an image processing unit that receives the plurality of surface images acquired by the image acquiring unit and processes the received surface images;
an indicator-based evaluation value calculating unit that calculates an evaluation value for each of the plurality of surface images processed by the image processing unit in accordance with a plurality of evaluation indicators;
input means for inputting an evaluation criterion;
a correlation coefficient calculating unit that calculates a correlation coefficient between the evaluation criterion input by the input means and each of the plurality of evaluation indicators, and selects an evaluation indicator that has the maximum correlation coefficient among the calculated correlation coefficients; and
a display unit that displays on a screen, the evaluation indicator that has the maximum correlation coefficient selected by the correlation coefficient calculating unit, as a recommended evaluation indicator,
wherein the display unit displays, on the screen, two or more of a numerical value indicating a similarity between the order of observation images arranged on the basis of the defined evaluation criterion and the order of observation images arranged on the basis of each of the plurality of evaluation indicators, a value indicating weight to be multiplied by each of the evaluation indicators to combine a plurality of evaluation indicators, and a numerical value indicating a similarity between orders of observation images arranged on the basis of the combined evaluation indicator.

13. An observation apparatus that observes a sample, comprising:
an image acquiring unit that acquires a plurality of images of a plurality of parts of the sample;
an image processing unit that receives the plurality of images acquired by the image acquiring unit and processes the received plurality of images;
a display unit that displays a plurality of processed images processed by the image processing unit;
an input unit for rearranging the plurality of processed images displayed on the display unit in response to an input of a user; and
a controller including an indicator-based evaluation value calculating unit that calculates an evaluation value for each of the plurality of processed images in accordance with a plurality of evaluation indicators, wherein:

the controller compares an evaluation criterion corresponding to an order of the plurality of processed images rearranged by the input unit with each of the plurality of evaluation indicators to evaluate whether each of the plurality of evaluation indicators is right or wrong, and the display unit displays, on the screen, two or more of a numerical value indicating a similarity between the order of the plurality of processed images arranged on the basis of the defined evaluation criterion and the order of the plurality of processed images arranged on the basis of each of the plurality of evaluation indicators, a value indicating weight to be multiplied by each of the evaluation indicators to combine a plurality of evaluation indicators, and a numerical value indicating a similarity between orders of the plurality of processed images arranged on the basis of the combined evaluation indicator.

14. The observation apparatus according to claim 13, wherein the image processing unit automatically samples an image that is to be observed among the plurality of images acquired by the image acquiring unit.

15. The observation apparatus according to claim 13, wherein the display unit displays, on the screen, the evaluation criterion, the plurality of processed images arranged in accordance with the evaluation criterion, the evaluation indicators, the plurality of processed images arranged in accordance with the evaluation indicators, an enlarged image of an image that is selected as an image to be evaluated among the plurality of processed images, an enlarged image of a reference image, a wafer map, and at least one of imaging conditions for the images.

16. The observation apparatus according to claim 13, wherein the sample is a semiconductor.

17. An observation system comprising:
a plurality of the observation apparatuses according to claim 13 connected to an information network through signal transmitting/receiving units, which transmit and receive a signal, of the plurality of the observation.

18. A method for observing a sample, comprising the steps of:
acquiring images of a plurality of parts of the sample;
performing image processing on the acquired images;
displaying the processed images;
rearranging the displayed images in response to an input of a user;
obtaining an evaluation value for each of the displayed images in accordance with a plurality of evaluation indicators;
comparing an evaluation criterion corresponding to an order of the displayed images rearranged by the user with each of the plurality of evaluation indicators to evaluate whether each of the plurality of evaluation indicators is right or wrong; and
causing a display unit to display, on the screen, two or more of a numerical value indicating a similarity between the order of observation images arranged on the basis of the defined evaluation criterion and the order of observation images arranged on the basis of each of the plurality of evaluation indicators, a value indicating weight to be multiplied by each of the evaluation indicators to combine a plurality of evaluation indicators, a numerical value indicating a similarity between orders of observation images arranged on the basis of the combined evaluation indicator.

19. The method according to claim 18, wherein an image that is to be observed among the acquired images, is automatically sampled.

20. The method according to claim 18, further comprising the step of causing a display unit to display, on the screen, the evaluation criterion, the processed images arranged in accordance with the evaluation criterion, the evaluation indicators, the processed images arranged in accordance with the evaluation indicators, an enlarged image of an image that is selected as an image to be evaluated among the processed images, an enlarged image of a reference image, a wafer map, and at least one of imaging conditions for the images.

21. The method according to claim 18, wherein the sample is a semiconductor.

* * * * *